United States Patent [19]

Samukawa et al.

[11] Patent Number: 5,013,401
[45] Date of Patent: May 7, 1991

[54] MICROWAVE PLASMA ETCHING METHOD AND APPARATUS

[75] Inventors: Seiji Samukawa, Tokyo; Masami Sasaki; Sumio Mori, both of Fuchu, all of Japan

[73] Assignees: NEC Corporation; Anelva Corporation, both of Tokyo, Japan

[21] Appl. No.: 497,077

[22] Filed: Mar. 21, 1990

[30] Foreign Application Priority Data

Mar. 27, 1989 [JP] Japan .................................. 1-74316

[51] Int. Cl.$^5$ ...................... B44C 1/22; C03C 15/00; C03C 25/06
[52] U.S. Cl. .................................. 156/643; 156/646; 156/345; 204/192.32; 204/298.38
[58] Field of Search .................... 156/643, 646, 345; 204/192.32, 298.38; 118/50.1, 620, 623; 427/38, 39

[56] References Cited

U.S. PATENT DOCUMENTS

| | | | |
|---|---|---|---|
| 4,401,054 | 8/1983 | Matsuo et al. | 118/723 |
| 4,559,100 | 12/1985 | Ninomiya et al. | 156/345 |
| 4,732,761 | 3/1988 | Machida et al. | 156/646 X |
| 4,844,767 | 7/1989 | Okudaira et al. | 156/643 X |
| 4,876,983 | 10/1989 | Fukuda et al. | 204/298.38 X |

FOREIGN PATENT DOCUMENTS 56-155535 12/1981 Japan .

OTHER PUBLICATIONS

"Microwave Plasma Etching", by Keizo Suzuki et al., Japanese Journal of Applied Physics, vol. 16, No. 11, pp. 1979-1984.

*Primary Examiner*—William A. Powell
*Attorney, Agent, or Firm*—Wenderoth, Lind & Ponack

[57] ABSTRACT

A microwave plasma etching method and apparatus for manufacturing electronic devices such as transistors. The method includes the steps of forming a stream of plasma from a processing gas within a plasma formation chamber by using an electric field produced by a microwave and an electron cyclotron resonance phenomenon produced by a magnetic field perpendicular to the electric field, and processing a substrate surface by locating it at the electron cyclotron resonance point and exposing it to a radiation of the plasma stream. The apparatus has a plasma formation chamber, a microwave introducing device connected to the plasma formation chamber, a magnetic field applying device for producing a magnetic field perpendicular to an electric field produced within the plasma formation chamber, and a gas introducing system for introducing a processing gas into the plasma formation chamber. A substrate holder is provided within the plasma formation chamber for holding a substrate at a resonance point of the electron cyclotron resonance phenomenon exhibited by the introduced microwave and applied magnetic field where the magnetic field has a particular strength.

8 Claims, 4 Drawing Sheets center

100 φ

150 φ

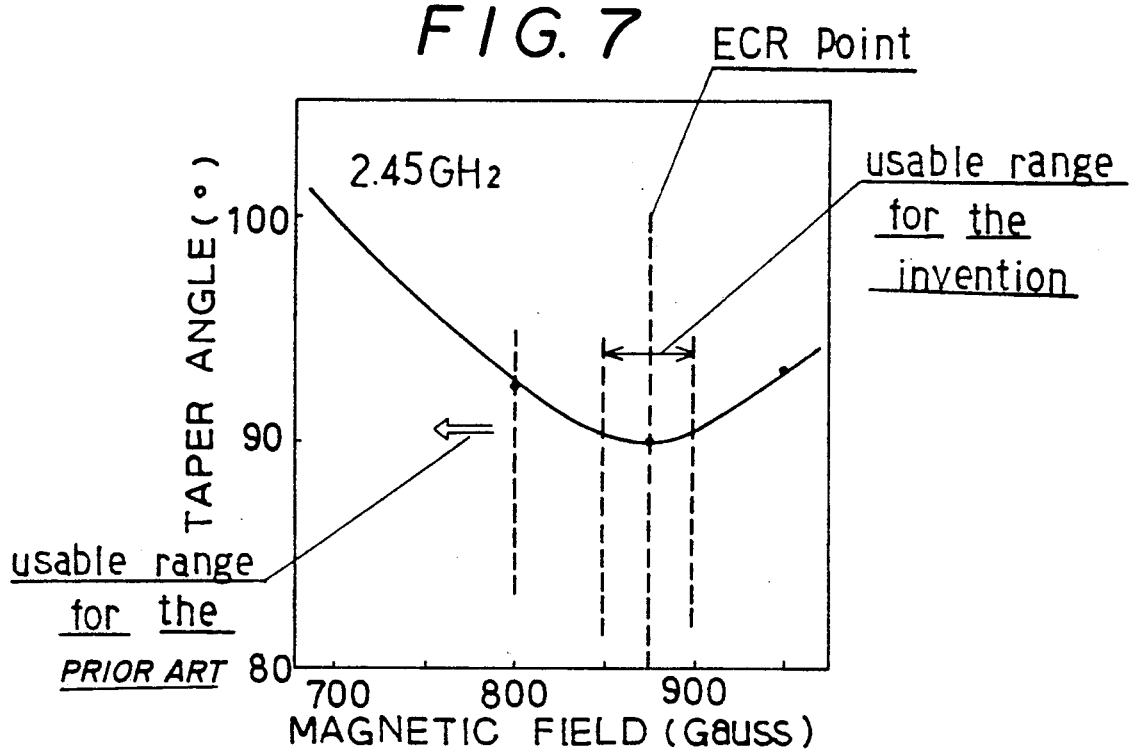
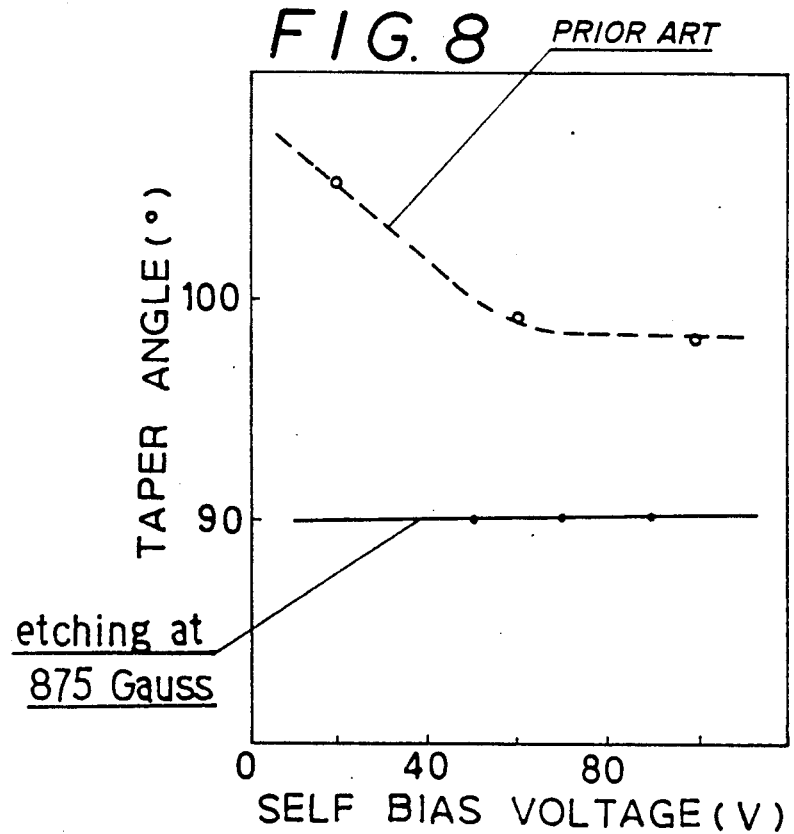

MICROWAVE PLASMA ETCHING METHOD AND APPARATUS

BACKGROUND OF THE INVENTION

1. Field of the Invention

The present invention relates to a microwave plasma etching method and apparatus for use in the manufacturing process of semiconductor devices and other similar electronics devices, wherein the apparatus may have applications such as the substrate surface etching process, the thin film formation or deposition on the substrate surface, and other types of the surface processing that involve the use of the plasma produced by the electron cyclotron resonance phenomenon.

2. Prior Art

The apparatus of the class as disclosed herein is currently available in two different types. One type is the apparatus that is described in Japan Published unexamined Patent Application No. Showa 56-155535. According to the microwave plasma processing technique as disclosed and taught in the publication cited above, a coil 3 is adapted to produce a magnetic field having a specific strength to be applied across a plasma formation chamber 1. A microwave generator 6 supplies a microwave energy into the plasma formation chamber 1 via a microwave energy waveguide 5 and a microwave inlet window 4, causing an electron cylotron resonance phenomenon to be produced within the plasma formation chamber 1. The energy that results from the electron cyclotron resonance interacts with a gaseous substance that has been introduced into the plasma formation chamber 1 through a gas supply source 7, thereby changing the gaseous substance into a plasma (as shown at 9). The plasma that has been created within the plasma formation chamber 1 is then fed as a plasma stream through its outlet window 14 into a substrate processing chamber 2, by utilizing the divergent magnetic field created by the above-mentioned magnetic field. In the substrate processing chamber 2, a substrate 15 to be processed, such as etching, is placed on its holder 10, and undergoes the etching process by the impact of the ionized gases against the surface of the substrate 15. In FIG. 3, reference numeral 12 designates a gas discharge port.

The other type is the apparatus that is described in Japan Published unexamined Patent Application No. Showa 60-1334423. In the microwave plasma processing techinique as disclosed and taught in that publication and shown in FIG. 4a and FIG. 4b, a plasma formation chamber 1 is also used, and a gradient magnetic field is applied across the plasma formation chamber 1. A microwave energy passes through a waveguide 5 and a microwave inlet window 4, and is introduced intothe plasma formation chamber via a quartez bell jar 13. The plasma formation chamber 1, which is located within the bell jar 13, has not the arrangement such that it can meet the requirements for the microwave cavity resonator, and a substrate holder 10 is placed within the plasma formation chamber 1 which also serves as the substrate processing chamber. From the above publication, it can only be seen that the substrate holder 10 is located within a distance of 300 mm away from the point where the maximum magnetic density is produced along the center axis through the plasma formation chamber 1 and in the direction of travel of the microwave. No other information is presented. But it may be evident from other relevant publications such as the "Nikkei Micro Devices" (p. 61, Jun. 1988) and the "SEMI Technology Symposium" (pp. 133-144, 1988), both of which discuss the apparatus in detail, that the substrate holder 10 is placed at the point where less than 800 Gauss is produced and which is located 2 cm away from the point where 875 Gauss is produced as the electron cyclotron resonance point when the microwave frequency of 2.45 GHz is applied.

The prior art technologies as described above have the respective disadvantages which will be described specifically below. For the type of apparatus mentioned first, when the geometrical pattern configuration formed on the substrate 15 surface by the etching process, which includes a center area a, a peripheral area b of 100 $\phi$, and the area c of 150 $\phi$ in the neighborhood of the peripheral area b as shown in FIG. 5, is microscopically observed, it may clearly be seen that the center area a has the pattern configuration which is normal to the substrate surface, but the configuration tends to have a greater incline with reference to the substrate surface toward the outer peripheral area. This tendency becomes more evident when a substrate to be processed has a greater diameter. The reasons for this may be explained as follows:

The plasma produced within the plasma formation chamber is placed under the influence of the divergent magnetic field applied across the plasma formation chamber, and goes as a plasma stream toward the substrate surface. The geometrical pattern configuration that is formed on the substrate surface may largely depend upon the angle of incidence at which the ionized gases strike against the substrate surface. The ions that contribute to the etching process are incident at inclined angles with reference to the substrate surface, particularly when striking against the outer peripheral area thereof. Thus, the outer peripheral area may present pattern forms that are inclined inwardly toward the inside. It may also be observed that the ionized gases have a low current density that may result in an increased ion energy, which causes defects to be introduced under the substrate surface.

It may also be observed that when the ionized gases are drawn out by the divergent magnetic field, they must travel over a long distance until they reach the substrate surface. During the travel, the ions may be scattering, and the scattered ions may cause more side etching.

It may readily be understood from the preceding description that there are several problems associated with the firstly mentioned type of the apparatus. Specifically, those problems are that the uniform etching pattern cannot be provided over the entire substrate surface, that the ions have the great energy, and that the side etching may easily be introduced.

Similarly, the problem associated with the secondly mentioned type of the apparatus is that the ion current density may be increased to some extent as compared with the first type of the apparatus, but the location where a substrate to be etched is placed deviates from the electron cyclotron resonance point. This requires that the energy of the ions incident upon the substrate surface be greater as shown in FIG. 6, and the substrate cannot exhibit any anisotropic etching property, even if a high bias voltage is applied across the substrate.

SUMMARY OF THE INVENTION

The object of the present invention is to overcome the problems described above for the two different types of the prior art electron cyclotron resonance apparatus, when the etching process, for example, occurs in the respective types. The present invention provides the high ion current density, the low ion energy, and the anisotropic etching properties. The feature of the present invention that distinguishes it from those conventional types is that a substrate to be etched, for example, is placed at a limited point which is selected to be located very near to the electron cyclotron resonance point.

The above object may be achieved, according to the present invention, such that a microwave energy causes an electric field to be produced within a plasma formation chamber, a magnetic field is produced perpendicularly to the electric field, an electron cyclotron resonance phenomenon that is exhibited by the electric field and magnetic field is used to change a processing gaseous substance into a plasma stream, and a substrate to be processed is placed at a point which is located very near to the electron cyclotron resonance point within the plasma where $\pm 3.0\%$ of the magnetic field strength at the resonance point is provided. It has been found that this arrangement allows the substrate to be placed under the influence of the magnetic lines of force normal to the substrate surface. As such, the ionized gases can attack the substrate at incident angles normal to its surface, and the ion current density that results from that can be increased. The substrate can be etched at the point where the lowest ion temperature occurs and with the highly accelerated speed, and the substrate that has been processed in this manner can exhibit the anisotropic properties, and contain less defects.

The results that have been obtained from the etching process according to the present invention are provided in FIGS. 7 and 8, respectively. In FIG. 7, a microwave energy of 2.45 GHz is applied, from which ECR plasma is produced. The resonance point is located at 875 Gauss. The results show that the range of 850 and 900 Gauss provides the practical values that may be used in forming the etching pattern at 90 degrees with reference to the substrate surface (FIG. 7). This value range can meet the taper angle requirements of 89 degrees to 91 degrees (90 degrees $\pm 1$) for the etching process that occurs in submicrons. Therefore, the practical requirements for the submicron etching can be met within the range of 850 and 900 Gauss, that is $875 \pm 3\%$, and this range can be used for this etching process. FIG. 8 shows the results that may be obtained when an RF bias voltage (such as 13.56 MHz) is applied across the substrate. How the pattern formed by etching varies with the varying self-bias voltage may be seen from FIG. 8. It is evident from the results in FIG. 8 that the pattern can always be formed at 90° regardless of any variations in the self-bias voltage. It should be noted that the applied RF voltage provides the much higher speed etching. As opposed to any of the prior art technologies, the present invention allows for the use of the lower RF bias voltage which provides the high-speed, anisotropic etching.

BRIEF DESCRIPTION OF THE DRAWINGS

Those and other objects, merits and advantages of the present invention will become more apparent from the detailed description of several preferred embodiments of the invention that follows with reference to the accompanying drawings, in which:

FIG. 4b shows the magnetic field strength of the field applied in the apparatus of FIG. 4a;

FIGS. 7 and 8 represent the variations in the pattern formed by the etching process according to the present invention.

DETAILED DESCRIPTION OF PREFERRED EMBODIMENTS

EXAMPLE 1

Figure 1:
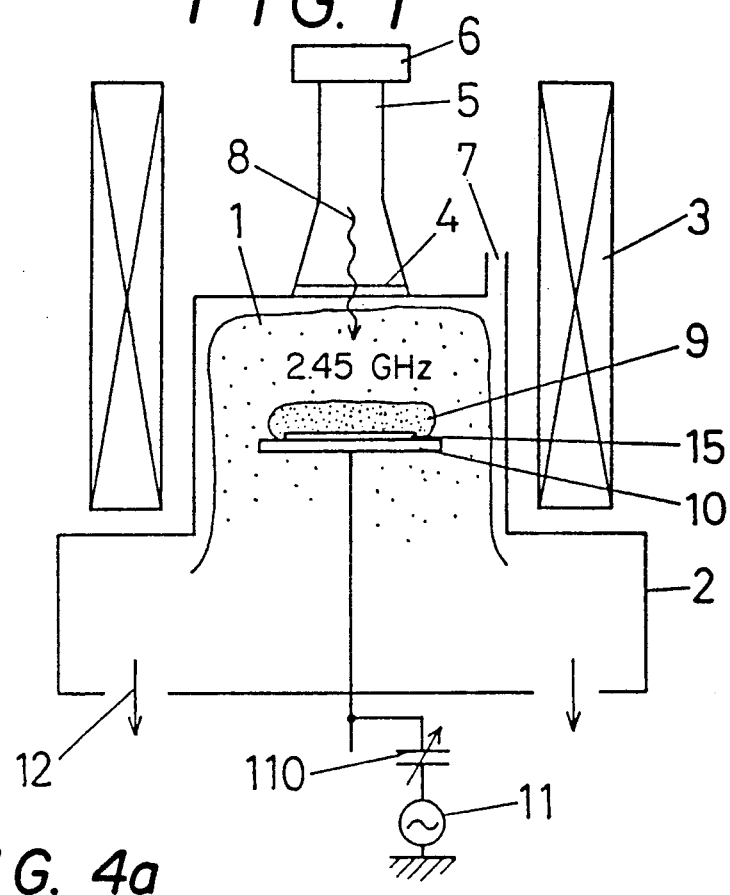
FIG. 1 is a schematic diagram showing a first embodiment of the microwave plasma processing apparatus according to the present invention, as viewed from its front side and as sectioned vertically.
Figure 4A:
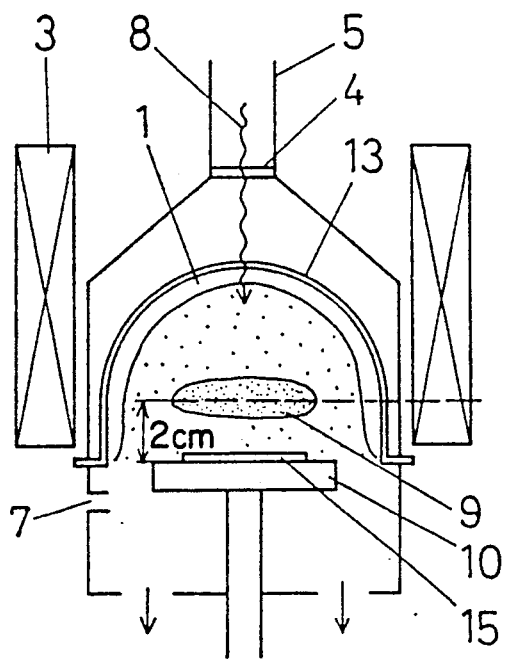
FIG. 4a is a similar diagram showing the second type of the prior art apparatus.
Figure 4B:
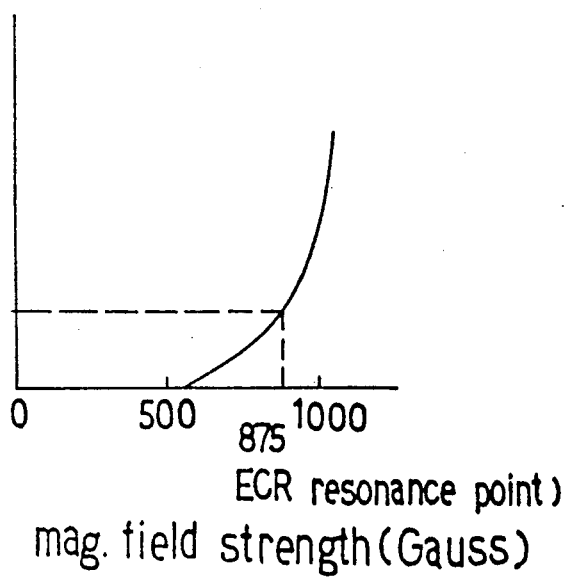
Figure 3:
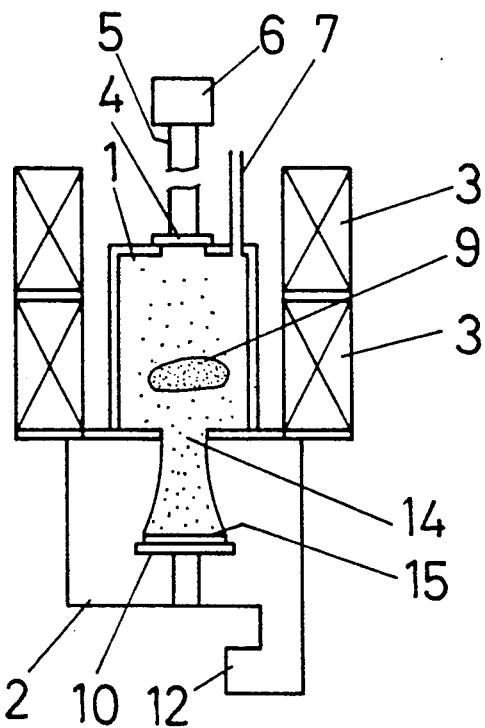
FIG. 3 is a similar diagram showing the first type of the prior art apparatus.
Figure 5A:
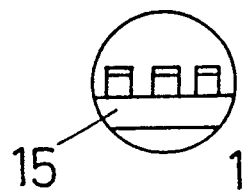
FIGS. 5a, 5b and 5c are schematic diagrams illustrating the pattern formed by the prior art etching process.
Figure 5B:
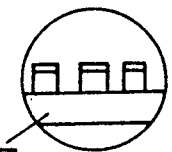
Figure 5C:
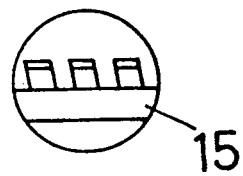
Figure 6:
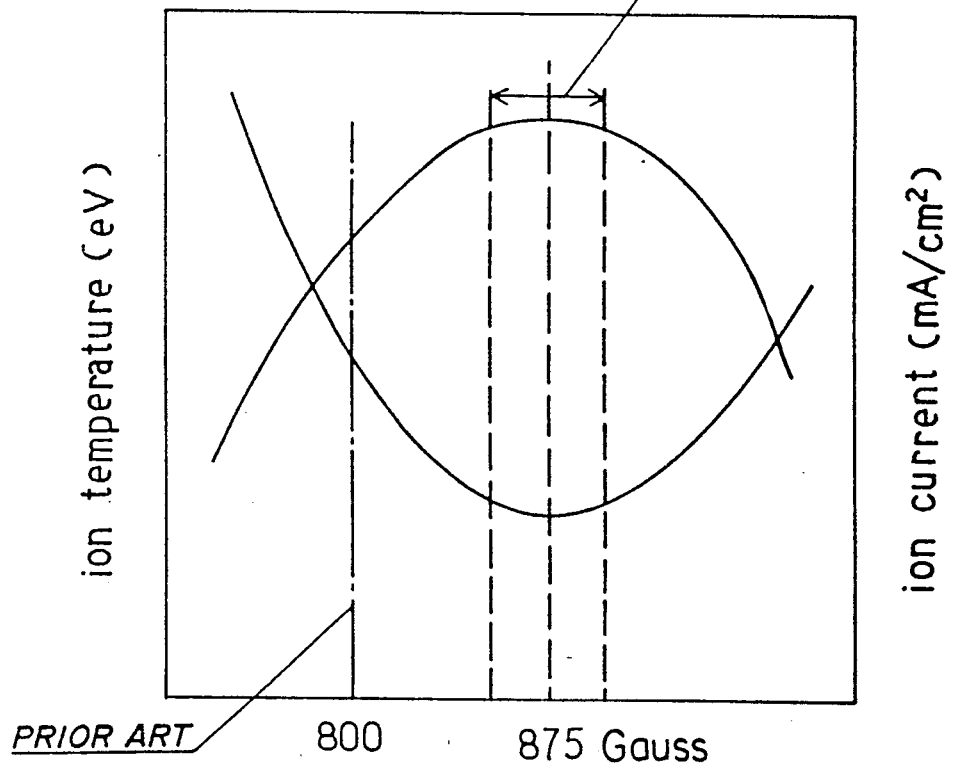
FIG. 6 is a graphical representation of the variations in the temperature and current density of the ions contained in the formed plasma, with reference to the varying magnetic field strength.

FIG. 1 is a sectional view showing an example of the first embodiment of the present invention. The apparatus shown in FIG. 1 includes similar parts or elements to those in FIG. 3, which are identified by the same reference numerals, and will not be described below to avoid the duplication.

As seen from FIG. 1, the apparatus includes a plasma formation chamber 1 in which a plasma is produced by the electron cyclotron resonance phenomenon, and a substrate transfer chamber 2 which is located adjacently to the plasma formation chamber 1. The plasma formation chamber 1 is formed to meet the requirements for the microwave cavity resonator which allows the microwave energy to provide the higher electric field strength and the higher discharging efficiency. The plasma formation chamber 1 is surrounded by a coreless solenoid coil 3, and has a gas inlet port 7 through which a gaseous substance is introduced into the plasma formation chamber 1 for producing a plasma, and an inlet window 4 which is made of any suitable insulating material such as qualtz or silica glass, ceramics, and the like.

A microwave energy is supplied by a microwave generator or power supply 6, and passes through a waveguide 5 and through the inlet window 5 into the plasma formation chamber 1. The plasma formation chamber 1 contains a substrate holder 10 therein which is placed at a particular point where a magnetic field strength of 875 Gauss $\pm 3.0\%$ may be produced when a particular microwave frequency, e.g., 2.45 GHz, is applied.

A substrate 15 which will undergo the etching process is transported by any suitable conveying means (not shown) into the substrate transfer chamber 2 where it is placed on the substrate holder 10. An RF power supply 11 supplies a RF voltage which is applied to the substrate holder 10 through its charging and discharging capacitor 110.

EXAMPLE 2

Figure 2:
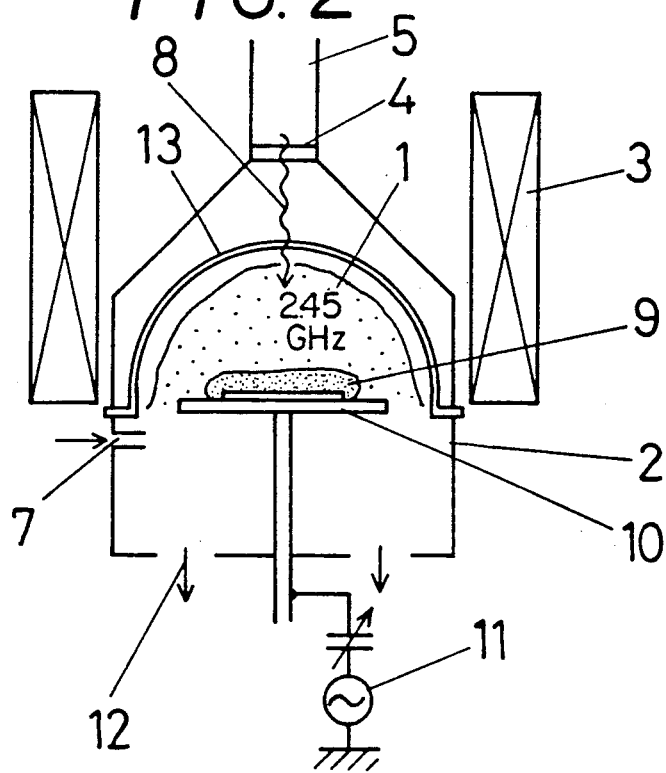
FIG. 2 is a similar diagram showing a second embodiment of the present invention.

FIG. 2 is a sectional view showing an example of the second embodiment of the present invention.

The apparatus in FIG. 2 differs from that in FIG. 1 in that the plasma formation chamber 1 where a plasma is produced by the electron cyclotron resonance phenomenon is not arranged such that it can meet the requirements for the microwave cavity resonator. Instead, it is arranged to allow a microwave energy to be introduced through the front side of a quartz bell jar 13. A gas inlet port 7 is provided on the substrate transfer chamber 2, as the gases cannot be introduced through the plasma formation chamber 1. The plasma formation chamber 1 contains a substrate holder 10 which is located at a particular point where a magnetic field strength of 875 Gauss±3.0% is produced, and across which a RF voltage is applied.

The microwave plasma processing apparatus according to the present invention has fully been described. It may be appreciated from the preceding description that a substrate can be processed, such as etching, at the electron cyclotron resonance point or at any other point located very near thereto. This ensures that the anisotropic etching process can be provided with the higher speed but involving less defects.

Although the present invention has been described with reference to to several preferred embodiments thereof, it should be understood that various changes and modifications may be made without departing from the spirit and scope of the invention.

What is claimed is:

1. A microwave plasma etching method which includes the steps of:
    forming a stream of plasma from a processing gas within a plasma formation chamber, by using an electric field produced by a microwave and an electron cyclotron resonance phenomenon produced by a magnetic field perpendicular to the electric field; and
    processing a substrate surface by exposing it to a radiation of the plasma stream, wherein the method further includes the step of processing the substrate susrface by locating it at the electron cyclotron resonance point.

2. A microwave plasma etching method which includes the steps of:
    forming a stream of plasma from a processing gas within a plasma formation chamber, by using an electric field produced by a microwave and an electron cyclotron resonance phenomenon produced by a magnetic field perpendicular to the electric field; and
    processing a substrate surface by exposing it to a radiation of the plasma stream, wherein the method further includes the step of processing the substrate surface by locating it at the point away from the electron cyclotron resonance point where the magnetic field has the strength equal to plus or minus 3%.

3. A microwave plasma etching method as defined in claim 1 or 2, wherein the step of processing the substrate surface comprises processing it by applying an RF bias voltage across the substrate.

4. A microwave plasma etching method as defined in claim 1 or 2, wherein the plasma formation chamber has the shape that meets the requirements for a microwave cavity resonator.

5. A microwave plasma etching method as defined in claim 1 or 2, wherein the plasma formation chamber is a quartz glass bell jar.

6. A microwave plasma etching apparatus which comprises:
    a plasma formation chamber;
    microwave introducing means connected to the plasma formation chamber;
    magnetic field applying means for producing a magnetic field perpendicular to an electric field produced within the plasma formation chamber;
    gas introducing means for introducing a processing gas into the plasma formation chamber; and
    a substrate holder within the plasma formation chamber for holding a substrate at a resonance point of the electron cyclotron resonance phenomenon exhibited by the introduced microwave and applied magnetic field where the magnetic field has a particular strength.

7. A microwave plasma etching apparatus which comprises:
    a plasma formation chamber;
    microwave introducing means connected to the plasma formation chamber;
    magnetic field applying means for producing a magnetic field perpendicular to an electric field produced within the plasma formation chamber;
    gas introducing means for introducing a processing gas into the plasma formation chamber; and
    a substrate holder within the plasma formation chamber for holding a substrate at a point away from the resonance point of the electron cyclotron resonance phenomenon exhibited by the introduced microwave and applied magnetic field where the magnetic field has the particular strength equal to plus or minus 3%.

8. A microwave plasma etching apparatus as defined in claim 6 or 7, further including RF power supply means connected to the substrate holder.

* * * * *